(12) United States Patent
Wagh et al.

(10) Patent No.: US 6,549,085 B1
(45) Date of Patent: Apr. 15, 2003

(54) NATURAL SAMPLING METHOD AND DEVICE FOR RF PULSE-WIDTH MODULATION

(75) Inventors: Poojan A. Wagh, Sleepy Hollow, IL (US); Pallab Midya, Palatine, IL (US); Patrick Rakers, Kildeer, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/995,122

(22) Filed: Nov. 27, 2001

(51) Int. Cl.[7] ................................................. H03K 7/08
(52) U.S. Cl. ........................ 332/109; 370/212; 375/238
(58) Field of Search ........................ 332/109; 370/212; 375/238; 341/138, 143, 144, 155; 327/26, 31; 342/202

(56) References Cited

U.S. PATENT DOCUMENTS

| | | |
|---|---|---|
| 5,838,210 A | 11/1998 | Midya et al. |
| 6,414,613 B1 * | 7/2002 | Midya et al. ................ 341/143 |
| 6,473,457 B1 * | 10/2002 | Pascual et al. .............. 375/238 |

OTHER PUBLICATIONS

"Integral Noise Shaping for Quantization of Pulse Width Modulation": Pallab Midya & Matt Miller; Motorola Labs, Schaumburg, Illinois and Mark Sandler, Kings College, London. An audio engineering society preprint, presented at the 109th Convention Sep. 22–25, 2000 in Los Angeles, California, USA.

"Prediction Correction Algorithm for Natural Pulse Width Modulation": Pallab Midya, Bill Roeckner, Pat Rakers, & Poojan Wagh; Motorola Labs, Schaumburg, Illinois. An audio engineering society preprint, presented at the 109th Convention Sep. 22–25, 2000 in Los Angeles, California, USA.

* cited by examiner

Primary Examiner—Robert Pascal
Assistant Examiner—Kimberly E Glenn
(74) Attorney, Agent, or Firm—Kenneth A. Haas

(57) ABSTRACT

A device for implementing a method for generating a pulse width modulated signal based upon a natural sampling technique is disclosed. First, a complex baseband signal is received by the device. Second, the device computes a first pulse edge vector and a second pulse edge vector as a function of the baseband signal. Third, the device computes a first set of natural sampling points as a function of the first pulse edge vector and computes a second set of natural sampling points as a function of the second pulse edge vector. These computations can involve one or more detections of a jump $k\pi$ within the first pulse edge vector and/or the second pulse edge vector. Finally, the pulse width modulated signal is generated with pulse edges corresponding to the first set of natural sampling points and the second set of natural sampling points.

21 Claims, 3 Drawing Sheets

-PRIOR ART-

NATURAL SAMPLING METHOD AND DEVICE FOR RF PULSE-WIDTH MODULATION

FIELD OF THE INVENTION

In general, the present invention relates to the field of communication systems. More specifically, the present invention relates to a generation of modulated radio frequency ("RF") signals.

BACKGROUND OF THE INVENTION

U.S. Pat. No. 5,838,210 describes a method for producing a modulated RF signal via pulse modulation. Specifically, U.S. Pat. No. 5,838,210 describes modulating the width of the pulse and the phase of the pulse. With conventional pulse width modulation (PWM), only the width of the pulse is modulated by a duty ratio signal. It is known in the art that the best method to produce a PWM signal is to implement natural-sampling whereby a duty ratio signal is compared to a varying periodic ramp to produce the PWM as shown in FIG. 1 with only the width of the pulse being modulated. However, in the RF-PWM case, both the duty ratio and phase of the pulse must be varied. Consequently, the varying ramp in FIG. 1 must also vary with the desired phase.

Prior art natural sampling methods allow for only the width to vary and do not allow for the fixed ramp to vary. They assume that the magnitude of the slope of the fixed ramp is a constant. In the case of RF-PWM, the slope of a ramp varies with the derivative of the phase. Therefore, prior art natural sampling methods target baseband PWM as opposed to RF-PWM, and therefore do not provide the requisite natural sampling.

Thus, there is a need for a new and unique natural sampling method for RF-PWM.

SUMMARY OF THE INVENTION

One form of the present invention is a method for generating a pulse width modulated signal. First, a complex baseband signal is received. Second, a first pulse edge vector and a second pulse edge vector are computed as a function of the complex baseband signal. Third, a first set of natural sampling points is determined as a function of the first pulse edge vector and a second set of natural sampling points is determined as a function of the second pulse edge vector. Finally, the pulse width modulated signal having a plurality of pulse edges corresponding to the first set of natural sample points and the second set of natural sample points is generated.

A second form of the present invention is a method for facilitating a generation of a pulse width modulated signal. First, a complex baseband signal is received. Second, a first pulse edge vector is computed as a function of the complex baseband signal. Third, a second pulse edge vector is computed as a function of the first pulse vector is response to a detection of a jump $k\pi$ within the first pulse edge vector.

The foregoing forms, and other forms, features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENTS

Figure 1:
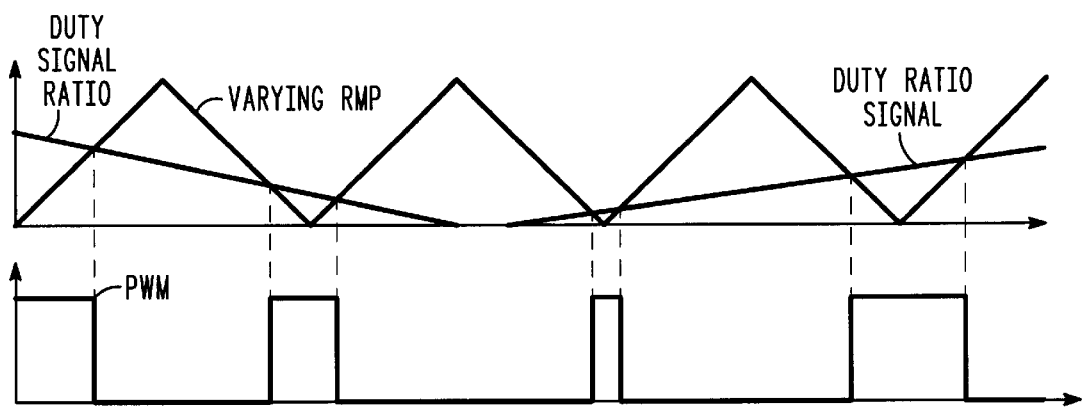
FIG. 1 illustrates an exemplary generation of a PWM signal as known in the art.
Figure 2:
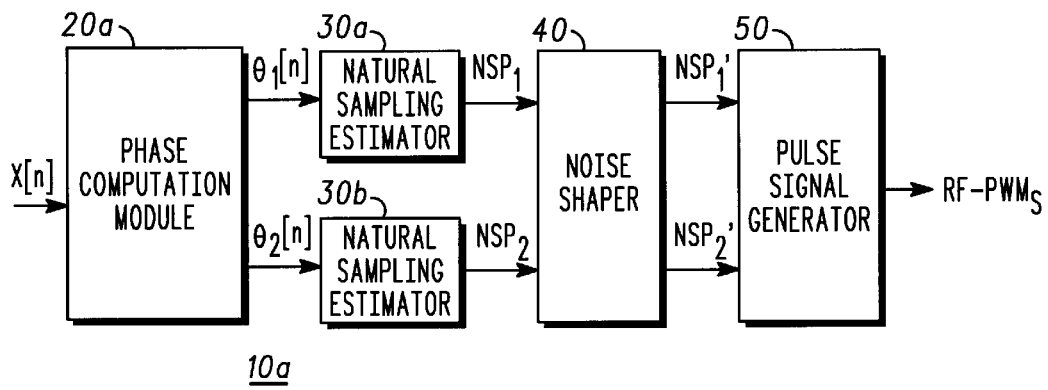
FIG. 2 illustrates a block diagram of a first embodiment of a modulated signal source in accordance with the present invention.

In FIG. 2, a modulated signal source $10a$ in accordance with one embodiment of the present invention is shown. The modulated signal source $10a$ comprises a pulse edge computation module $20a$, a pair of natural sampling estimators $30a$ and $30b$, an optional noise shaper $40$, and a pulse signal generator $50$. The modulated signal source $10a$, as will be appreciated by those having ordinary skill in the art from the subsequent description herein, can be employed within various communication systems and communication devices, such as, for example, cellular phones, base stations, satellites, car mobile radios, wireless network transceivers, and cable or digital subscriber line modems.

The pulse edge computation module $20a$ receives a complex baseband signal $x[n]$ in digital form that equals $1+jQ$ where $1$ is a baseband in-phase signal, $j$ is a square root of $-1$, and $Q$ is a baseband quadrature signal. In response thereto, the pulse edge computation module $20a$ computes and provides L samples in pulse edge vector $\theta_1[n]$ and L samples in pulse edge vector $\theta_2[n]$, which are representative of the rising edges and the falling edges of a desired pulse width modulated signal $RF\text{-}PWM_S$. In one embodiment, the pulse edge computation module $20a$ computes the pulse edge vector $\theta_1[n]$ and pulse edge vector $\theta_2[n]$ in accordance with the following equations [1] and [2], respectively:

$$\theta_1[n] = \begin{matrix} \angle x[n] + \sin^{-1}|x[n]| + 2I_1^1[n]\pi \\ \vdots \\ \angle x[n-L] + \sin^{-1}|x[n-L+1]| + 2I_1^L[n]\pi \end{matrix} \quad [1]$$

$$\theta_2[n] = \begin{matrix} \angle x[n] - \sin^{-1}|x[n]| + 2I_2^1[n]\pi \\ \vdots \\ \angle x[n-L] - \sin^{-1}|x[n-L+1]| + 2I_2^L[n]\pi \end{matrix} \quad [2]$$

The $m^{th}$ element of the pulse edge vector $\theta_1[n]$ is designated as $\theta_1^m[n]$. Conversely, the $m^{th}$ element of the pulse edge vector $\theta_2[n]$ is designated as $\theta_2^m[n]$. The vector size L can be chosen to encompass more than one switching period. In this case, the index $m_0$ designates an index of the vector, which corresponds to a sample time within the current switching period, preferably in the center of the switching period. The integers $I_1[n]$ are chosen to unwrap jumps of $2\pi$ or multiples thereof and to bring $\theta_1^{m_0}[n]$ within the range of the fixed ramp, preferably $(-\pi, \pi]$. Similarly, the integers $I_2[n]$ are chosen to unwrap jumps of $2\pi$ or multiples thereof and to bring $\theta_2^{m_0}[n]$ within the range of the fixed ramp, preferably $(-\pi, \pi]$.

In response to the pulse edge vector $\theta_1[n]$, the natural sampling estimator 30a determines and provides one or more natural sampling points $NSP_1$ as a result of the natural sampling operation on pulse edge vectors $\theta_1[n]$. In response to the pulse edge $\theta_2[n]$, the natural sampling estimator 30b determines and provides one or more natural sampling points $NSP_2$ as a result of a natural sampling operation on the pulse edge vector $\theta_2[n]$. As such, the natural sampling estimator 30a and the natural sampling estimator 30b can be based upon one of many conventional natural sampling techniques such as, for example, U.S. patent application Ser. No. 09/478,024 by Midya et al, filed Jan. 5, 2000, the entirety of which is hereby incorporated by reference. An operational embodiment of the natural sampling estimator 30a and the natural sampling estimator 30b, however, are predicated upon the operational requirements of a communication system or communication device including a modulated signal source in accordance with the present invention.

Figure 3:
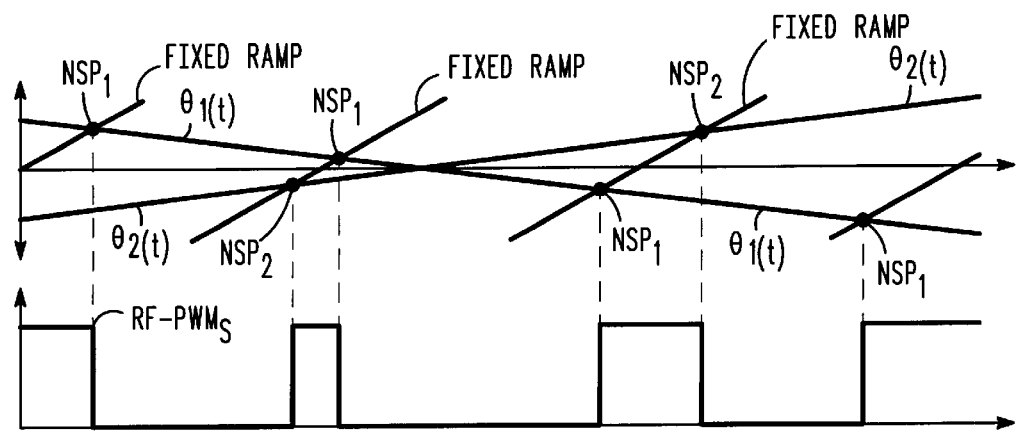
FIG. 3 illustrates an exemplary set of pulse edges and a RF-PWM signal generated by the modulated signal source of FIG. 2.

In FIG. 3, an exemplary determination of several natural sampling points $NSP_1$ and a couple of natural sampling points $NSP_2$ is shown. Specifically, each intersection of a fictitious signal $\theta_1(t)$ with a fixed ramp constitutes a natural sampling point $NSP_1$, and each intersection of a fictitious signal $\theta_2(t)$ with a fixed ramp constitutes a natural sampling point $NSP_2$. The fictitious signal $\theta_1(t)$ is a continuous signal formed by an interpolation of the elements of the pulse edge vector $\theta_1[n]$ in accordance with an interpolation method used within the natural sample estimator 30b, and the fictitious signal $\theta_2(t)$ is a continuous signal formed by an interpolation of the elements of the pulse edge vector $\theta_2[n]$ in accordance with an interpolation method used within the natural sample estimator 30b.

In response to the natural sampling point(s) $NSP_1$ and the natural sampling point(s) $NSP_2$, the noise shaper 40 conventionally generates and provides natural sampling point(s) $NSP_1'$ as a noise shaped version of the natural sampling point(s) $NSP_1$ and natural sampling point(s) $NSP_2'$ as a noise shaped version of the natural sampling point(s) $NSP_2$. In one embodiment, the noise shaper 40 is designed in accordance with a U.S. patent application Ser. No. 09/478,013 that was filed Jan. 5, 2000, and is entitled "APPARATUS FOR NOISE SHAPING A PULSE WIDTH MODULATION (PWM) SIGNAL AND METHOD THEREFOR", the entirety of which is hereby incorporated by reference. An operational embodiment of the noise shaper 40, however, is predicated upon the operational requirements of a communication system or communication device including a modulated signal source in accordance with the present invention.

In response to the natural sampling point(s) $NSP_1'$ and the natural sampling point(s) $NSP_2'$, the pulse signal generator 50 conventionally generates and provides the pulse width modulated signal $RF\text{-}PWM_S$ having pulse edges thereof coinciding with natural sampling point(s) $NSP_1$ or natural sampling point(s) $NSP_2$ as exemplary shown in FIG. 3. As such, the pulse signal generator 50 can be based upon one of many pulse generation techniques. An operational embodiment of the pulse generator 50, however, is predicated upon the operational requirements of a communication system or communication device including a modulated signal source in accordance with the present invention.

Each component of the modulated signal source 10a as described may be implemented in hardware (analog or digital), software, or any combination of hardware and software. Those having ordinary skill in the art will appreciate a sequential operation of the components of the modulated signal source 10a (e.g., in a software implementation) and a concurrent operation of each component of the modulated signal source 10a (e.g., in a hardware implementation).

Figure 4:
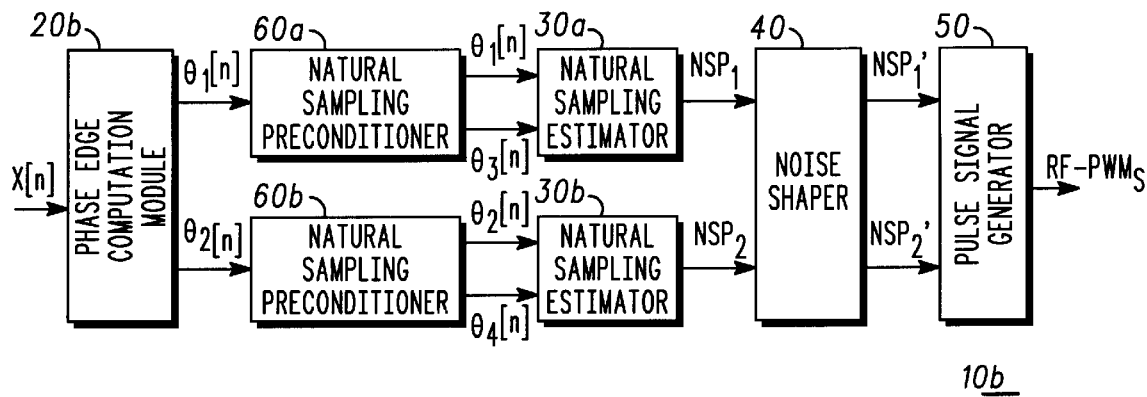
FIG. 4 illustrates a block diagram of a second embodiment of a modulated signal source in accordance with the present invention.

In FIG. 4, a modulated signal source 10b in accordance with a second embodiment of the present invention is shown. The modulated signal source 10b includes a pulse edge computation module 20b, a pair of natural sampling preconditioners 60a and 60b in addition to the natural sampling estimator 30a, the natural sampling estimator 30b, the noise shaper 40, and the pulse signal generator 50. The modulated signal source 10b, as will be appreciated by those having ordinary skill in the art from the subsequent description herein, can be employed within various communication systems and communication devices, such as, for example, cellular phones, base stations, satellites, car mobile radios, wireless network transceivers, and cable or digital subscriber line modems.

Figure 5:
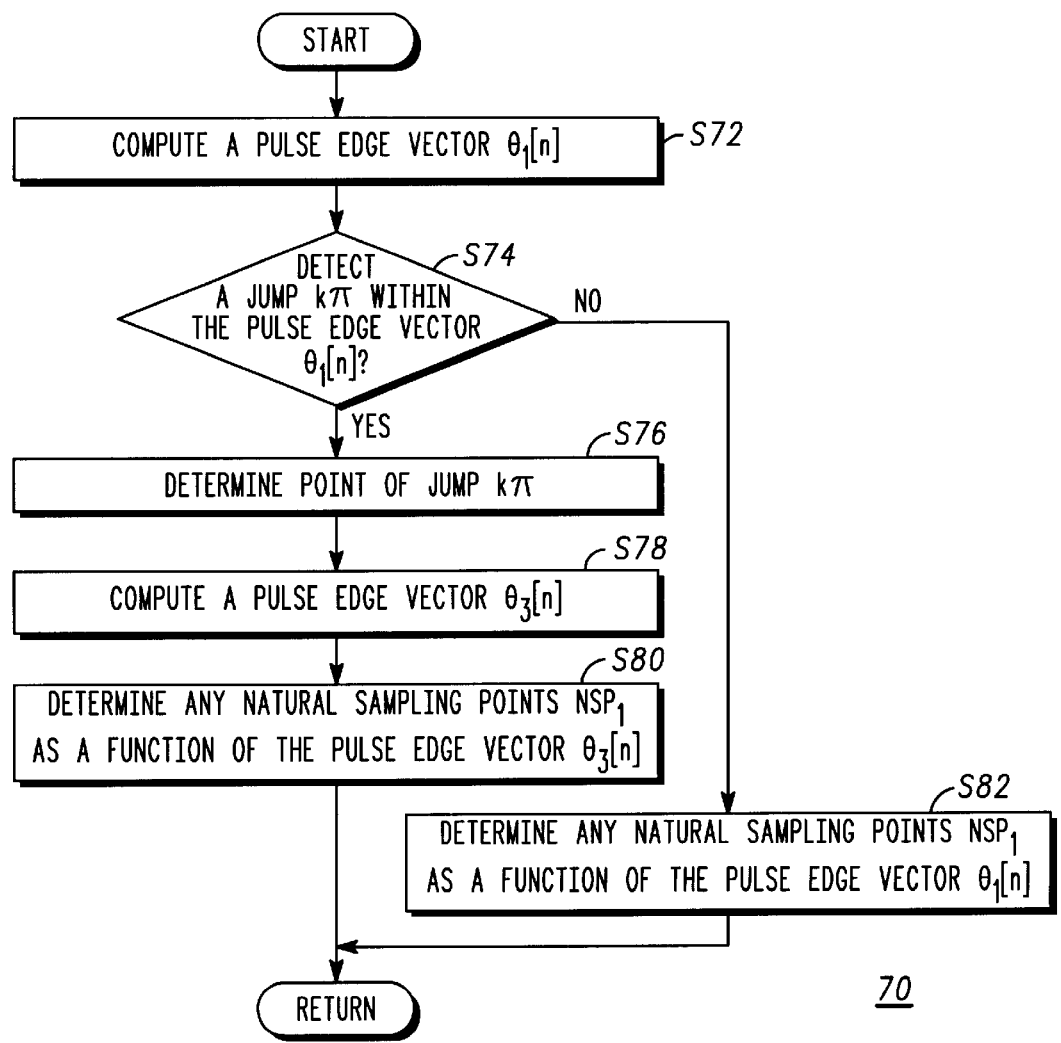
FIG. 5 illustrates a flowchart representative of a second embodiment of a RF-PWM natural sampling method in accordance with the present invention.

In FIG. 5, a flowchart 70 that is representative of a natural sampling method of the present invention is shown. During a stage S72 of the flowchart 70, the pulse edge computation module 20b computes and provides a pulse edge vector $\theta_1[n]$. In one embodiment, the pulse edge vector $\theta_1[n]$ is computed in accordance with the equation [1] as previously described herein.

Upon completion of the stage S72, the natural sampling preconditioner 60a proceeds to a stage S74 of the flowchart 70 to detect any occurrence of a jump $k\pi$ within the pulse edge vector $\theta_1[n]$ due to a zero crossing of the complex baseband signal $x[n]$. In one embodiment, a jump $k\pi$ within the pulse edge vector $\theta_1[n]$ is detected in accordance with the following condition [3]:

$$\bigcup_m \left( \frac{3\pi}{4} < \left| \theta_1^m[n] - \theta_1^{m-1}[n] \right| < \frac{5\pi}{4} \right) \qquad [3]$$

The index m covers the set of vector indices within the current switching period of interest, excluding the first sample within the switching period of interest. The first index in which a jump occurs during the current switching period is denoted $m_j[n]$. Since the complex baseband signal $x[n]$ has bandwidth lower than the switching frequency, one can assume that only one jump in phase occurs during a switching period.

The natural sampling preconditioner 60a provides the pulse edge vector $\theta_1[n]$ to the natural sampling estimator 30a when the pulse edge vector $\theta_1[n]$ sample does not satisfy the condition [3] during stage the S74. In response thereto, the natural sampling estimator 30a proceeds to a stage S82 of the flowchart 70 to conventionally determine any natural sampling point $NSP_1$ as a function of the pulse edge vector $\theta_1[n]$ as previously described herein in connection with FIG. 2 and exemplary shown in the FIG. 3. Upon completion of the stage S82, the flowchart 70 returns to stage S72 to process a subsequent pulse edge vector $\theta_1[n]$. The natural sampling point(s) $NSP_1$ determined during the stage S80 are thereafter conventionally processed through the noise shaper 40 and the pulse signal generator 50 to generate corresponding pulse edges of the pulse width modulated signal $RF\text{-}PWM_S$ as previously described herein in connection with the FIG. 2 and exemplary shown in the FIG. 3.

Conversely, the natural sampling preconditioner 60a proceeds to a stage S76 of the flowchart when the pulse edge vector $\theta_1[n]$ satisfies the condition [3] during stage S74. During the stage S76, the natural sampling preconditioner 60a determines the point of the jump $k\pi$. In one embodiment, the point of the jump $k\pi$ is determined by finding a zero crossing of a duty ratio d[n] prior to the jump kπ and of negative duty ratio −d[n] after the jump kπ in accordance with the following equation [4]:

$$d[n]=\sin^{-1}|x[n]| \quad [4]$$

Preferably, the zero crossing is determined through a conventional polynomial curve fit.

One can interpolate a pulse edge vector $\theta_1'[n]$, a modified version of pulse edge vector $\theta_1[n]$ at the point of the jump kπ to obtain a jump interpolated edge value $\theta_1^a[n]$. In one embodiment, the pulse edge vector $\theta_1'[n]$ is computed in accordance with the following equation [5]:

$$\theta_1^{m'}[n] = \begin{cases} \theta_1^m[n] & m < m_j \\ \theta_1^m[n] + k_1[n]\pi & m \geq m_j \end{cases} \quad [5]$$

where $k_1[n]$ is an integer to minimize the jump in the pulse edge vector $\theta_1'[n]$ (e.g., +1 if the jump was −π and −1 if the jump was π). By inspection of an initial edge value $\theta_1^b[n]$ (the component of the pulse edge vector $\theta_1[n]$ corresponding to the start of the switching period) and jump interpolated edge value $\theta_1^a[n]$, one can determine whether a natural sampling point $NSP_1$ would occur before or after the jump kπ For example, if the hypothetical line intersecting the two points $\theta_1^a[n]$ and $\theta_1^b[n]$ intersects the fixed ramp, the natural-sampling point $NSP_1$ would occur before the jump kπ. Otherwise, the natural-sampling point $NSP_1$ would occur after the jump kπ.

Upon completion of the stage S76, the natural sampling preconditioner 60a proceeds to a stage S78 of the flowchart 70 to compute and provide a pulse edge vector $\theta_3[n]$. In one embodiment, if the natural sampling point $NSP_1$ would occur after the jump kπ, the pulse edge vector $\theta_3[n]$ is computed in accordance with the following equation [6a]:

$$\theta_3^m[n] = \begin{cases} \theta_1^m[n] + k_1[n]\pi & m < m_j \\ \theta_1^m[n] & m \geq m_j \end{cases} \quad [6a]$$

where $k_1[n]$ is as an integer to minimize the jump in the pulse edge vector $\theta_3[n]$ (e.g., −1 if the jump was −π and +1 if the jump was π). If the $NSP_1$ would occur prior to the jump kπ, the pulse edge vector $\theta_3[n]$ is computed in accordance with the following equation [6b]:

$$\theta_3^m[n] = \begin{cases} \theta_1^m[n] & m < m_j \\ \theta_1^m[n] + k_1[n]\pi & m \geq m_j \end{cases} \quad [6b]$$

where $k_1[n]$ is an integer to minimize the jump in the pulse edge vector $\theta_3[n]]$ (e.g., +1 if the jump was −π and −1 if the jump was π).

Upon completion of the stage S78, the natural sampling preconditioner 60a provides the pulse edge vector $\theta_3[n]$ to the natural sampling estimator 30a. In response thereto, the natural sampling estimator 30a proceeds to a stage S80 of the flowchart 70 to conventionally determine any natural sampling point $NSP_1$ as a function of the pulse edge vector $\theta_3[n]$ as previously described herein in connection with FIG. 2 and exemplary shown in the FIG. 3. Upon completion of the stage S80, the flowchart 70 returns to stage S72 to process a subsequent pulse edge vector $\theta_1[n]$. The natural sampling point(s) $NSP_1$ determined during the stage S80 are thereafter conventionally processed through the noise shaper 40 and the pulse signal generator 50 to generate corresponding pulse edges of the pulse width modulated signal RF-PWM$_S$ as previously described herein in connection with the FIG. 2 and exemplary shown in the FIG. 3.

Figure 6:
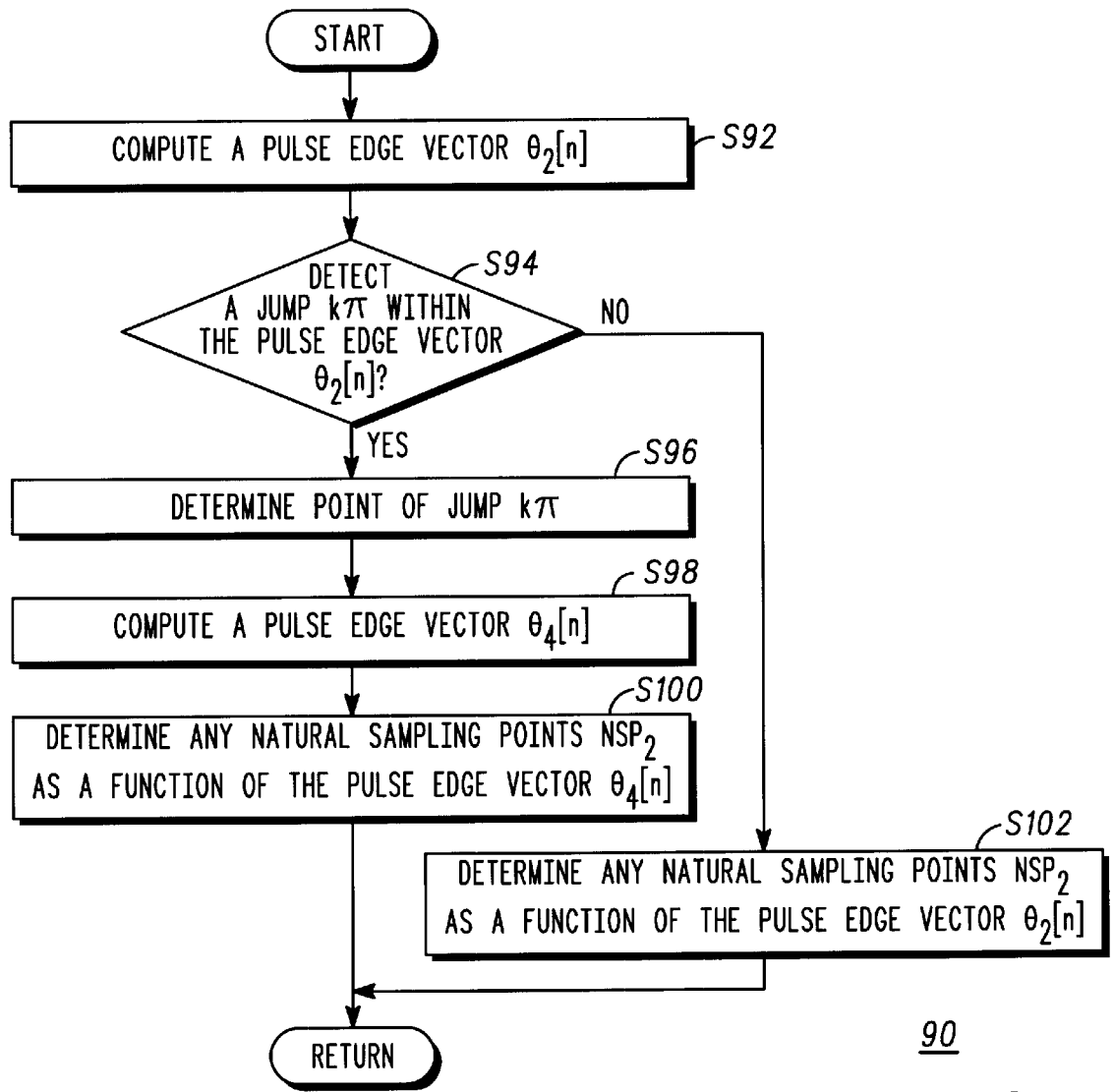
FIG. 6 illustrates a flowchart representative of a third embodiment of a RF-PWM natural sampling method in accordance with the present invention.

In FIG. 6, a flowchart 90 that is representative of a natural sampling method of the present invention is shown. During a stage S92 of the flowchart 90, the pulse edge computation module 20b computes and provides a pulse edge vector $\theta_2[n]$. In one embodiment, the pulse edge vector $\theta_2[n]$ is computed in accordance with the equation [2] as previously described herein.

Upon completion of the stage S92, the natural sampling preconditioner 60b proceeds to a stage S94 of the flowchart 90 to detect any occurrence of a jump kπ within the pulse edge vector $\theta_2[n]$ due to a zero crossing of the complex baseband signal x[n]. In one embodiment, a jump kπ within the pulse edge vector $\theta_2[n]$ is detected in accordance with the following condition [7]:

$$\bigcup_m \left(\frac{3\pi}{4} < \left|\theta_2^m[n] - \theta_2^{m-1}[n]\right| < \frac{5\pi}{4}\right) \quad [7]$$

The index m covers the set of vector indices within the current switching period of interest, excluding the first sample within the switching period of interest. The first index in which a jump occurs during the current switching period is denoted $m_j[n]$. Since the complex baseband signal x[n] has bandwidth lower than the switching frequency, one can assume that only one jump in phase occurs during a switching period.

The natural sampling preconditioner 60b provides the pulse edge vector $\theta_2[n]$ to the natural sampling estimator 30b when the pulse edge vector $\theta_2[n]$ sample does not satisfy the condition [7] during stage the S94. In response thereto, the natural sampling estimator 30b proceeds to a stage S102 of the flowchart 90 to conventionally determine any natural sampling point $NSP_2$ as a function of the pulse edge vector $\theta_2[n]$ as previously described herein in connection with FIG. 2 and exemplary shown in the FIG. 3. Upon completion of the stage S102, the flowchart 90 returns to stage S92 to process a subsequent pulse edge vector $\theta_2[n]$. The natural sampling point(s) $NSP_2$ determined during the stage S100 are thereafter conventionally processed through the noise shaper 40 and the pulse signal generator 50 to generate corresponding pulse edges of the pulse width modulated signal RF-PWM$_S$ as previously described herein in connection with the FIG. 2 and exemplary shown in the FIG. 3.

Conversely, the natural sampling preconditioner 60b proceeds to a stage S96 of the flowchart when the pulse edge vector $\theta_2[n]$ satisfies the condition [7] during stage S94. During the stage S96, the natural sampling preconditioner 60b determines the point of the jump kπ. In one embodiment, the point of the jump kπ is determined by finding a zero crossing of a positive duty ratio d[n] prior to the jump kπ and of negative duty ration −d[n] after the jump kπ in accordance the equation [4] as previously described herein. One can interpolate a pulse edge vector $\theta_2'[n]$, a modified version of pulse edge vector $\theta_2[n]$ at the point of the jump kπ to obtain a jump interpolated edge value $\theta_2^a[n]$. In one embodiment, the pulse edge vector $\theta_2'[n]$ is computed in accordance with the following equation [8]:

$$\theta_2^{m'}[n] = \begin{cases} \theta_1^m[n] & m < m_j \\ \theta_2^m[n] + k_1[n]\pi & m \geq m_j \end{cases} \quad [8]$$

where $k_2[n]$ is an integer to minimize the jump in the pulse edge vector $\theta_2'[n]$ (e.g., +1 if the jump was −π and −1 if the jump was π). By inspection of an initial edge value $\theta_2^b[n]$ (the component of the pulse edge vector $\theta_2[n]$ corresponding to the start of the switching period) and jump interpolated edge value $\theta_2^a[n]$, one can determine whether a natural sampling point $NSP_2$ would occur before or after the jump kπ. For example, if the hypothetical line intersecting the two points $\theta_2^a[n]$ and $\theta_2^b[n]$ intersects the fixed ramp, the natural-sampling point $NSP_2$ would occur before the jump kπ. Otherwise, the natural-sampling point $NSP_2$ would occur after the jump kπ.

Upon completion of the stage S96, the natural sampling preconditioner 60b proceeds to a stage S98 of the flowchart 90 to compute and provide a pulse edge vector $\theta_4[n]$. In one embodiment, if the natural sampling point $NSP_2$ would occur after the jump kπ, the pulse edge vector $\theta_4[n]$ is computed in accordance with the following equation [9a]:

$$\theta_4^m[n] = \begin{cases} \theta_2^m[n] + k_2[n]\pi & m < m_j \\ \theta_2^m[n] & m \geq m_j \end{cases} \quad [9a]$$

where $k_2[n]$ is as an integer to minimize the jump in the pulse edge vector $\theta_4[n]$ (e.g., −1 if the jump was −π and +1 if the jump was π). If the $NSP_2$ would occur prior to the jump kπ, the pulse edge vector $\theta_4[n]$ is computed in accordance with the following equation [9b]:

$$\theta_4^m[n] = \begin{cases} \theta_2^m[n] & m < m_j \\ \theta_2^m[n] + k_2[n]\pi & m \geq m_j \end{cases} \quad [9b]$$

where $k_2[n]$ is as an integer to minimize the jump in the pulse edge vector $\theta_4[n]$ (e.g., +1 if the jump was −π and −1 if the jump was π).

Upon completion of the stage S98, the natural sampling preconditioner 60b provides the pulse edge vector $\theta_4[n]$ to the natural sampling estimator 30b. In response thereto, the natural sampling estimator 30b proceeds to a stage S100 of the flowchart 90 to conventionally determine any natural sampling point $NSP_2$ as a function of the pulse edge vector $\theta_4[n]$ as previously described herein in connection with FIG. 2 and exemplary shown in the FIG. 3. Upon completion of the stage S100, the flowchart 90 returns to stage S92 to process a subsequent pulse edge vector $\theta_2[n]$. The natural sampling point(s) $NSP_2$ determined during the stage S100 are thereafter conventionally processed through the noise shaper 40 and the pulse signal generator 50 to generate corresponding pulse edges of the pulse width modulated signal $RF\text{-}PWM_S$ as previously described herein in connection with the FIG. 2 and exemplary shown in the FIG. 3.

Each component of the modulated signal source 10b as described may be implemented in hardware (analog or digital), software, or any combination of hardware and software. Those having ordinary skill in the art will appreciate a sequential operation of the components of the modulated signal source 10b (e.g., in a software implementation) and a concurrent operation of each component of the modulated signal source 10b (e.g., in a hardware implementation).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A method, comprising:

receiving a complex baseband signal;

computing a first pulse edge vector and a second pulse edge vector as a function of the complex baseband signal;

determining a first set of natural sampling points as a function of the first pulse edge vector and a second set of natural sampling points as a function of the second pulse edge vector; and generating a pulse width modulated signal having a plurality of pulse edges corresponding to the first set of natural sample points and the second set of natural sample points.

2. The method of claim 1, wherein the first pulse edge vector is computed according to:

$$\theta[n] = \begin{array}{c} Lx[n] + \sin^{-1}|x[n]| + 2l_1^1[n]\pi \\ \vdots \\ Lx[n-L] + \sin^{-1}|x[n-L+1]| + 2l_1^L[n]\pi \end{array}$$

3. The method of claim 1, wherein the second pulse edge vector is computed according to:

$$\theta[n] = \begin{array}{c} Lx[n] - \sin^{-1}|x[n]| + 2l_1^1[n]\pi \\ \vdots \\ Lx[n-L] - \sin^{-1}|x[n-L+1]| + 2l_1^L[n]\pi \end{array}$$

4. A device, comprising:

means for computing a first pulse edge vector and a second pulse edge vector as a function of a complex baseband signal;

means for determining a first set of natural sampling points as a function of the first pulse edge vector and a second set of natural sampling points as a function of the second pulse edge vector; and means for generating a pulse width modulated signal having pulse edges corresponding to the first set of natural sample points and the second set of natural sample points.

5. A device, comprising:

a first module operable to compute a first pulse edge vector and a second pulse edge vector as a function of a complex baseband signal;

a second module operable to determine a first set of natural sampling points as a function of the first pulse edge vector and a second set of natural sampling points as a function of the second pulse edge vector; and a third module operable to generate a pulse width modulated signal having a plurality of pulse edges corresponding to the first set of natural sample points and the second set of natural sample points.

6. The device of claim 1, wherein said first module computes the second pulse edge vector according to:

$$\theta[n] = \begin{array}{c} Lx[n] + \sin^{-1}|x[n]| + 2l_1^1[n]\pi \\ \vdots \\ Lx[n-L] + \sin^{-1}|x[n-L+1]| + 2l_1^L[n]\pi \end{array}$$

7. The device of claim 1, wherein said first module computes the second pulse edge vector according to:

$$\theta[n] = \begin{matrix} \angle x[n] - \sin^{-1}|x[n]| + 2l_1^1[n]\pi \\ \vdots \\ \angle x[n-L] - \sin^{-1}|x[n-L+1]| + 2l_1^L[n]\pi. \end{matrix}$$

8. A method, comprising:

receiving a complex baseband signal;

computing a first pulse edge vector as a function of the complex baseband signal; and computing a second pulse edge vector as a function of the first pulse vector in response to a detection of a jump $k\pi$ within the first pulse edge vector.

9. The method of claim 8, further comprising:

determining at least one natural sampling point as a function of the second pulse edge vector; and generating at least one pulse edge of a pulse width modulated signal, the at least one pulse edge corresponding to the at least one natural sampling point.

10. The method of claim 8, wherein the first pulse edge vector is computed according to:

$$\theta[n] = \begin{matrix} \angle x[n] + \sin^{-1}|x[n]| + 2l_1^1[n]\pi \\ \vdots \\ \angle x[n-L] + \sin^{-1}|x[n-L+1]| + 2l_1^L[n]\pi. \end{matrix}$$

11. The method of claim 8, wherein the first pulse edge vector is computed according to:

$$\theta[n] = \begin{matrix} \angle x[n] - \sin^{-1}|x[n]| + 2l_1^1[n]\pi \\ \vdots \\ \angle x[n-L] - \sin^{-1}|x[n-L+1]| + 2l_1^L[n]\pi. \end{matrix}$$

12. The method of claim 8, wherein the jump $k\pi$ is detected according to:

$$\bigcup_m \left( \frac{3\pi}{4} < \left| \theta^m[n] - \theta^{m-1}[n] \right| < \frac{5\pi}{4} \right).$$

13. The method of claim 8, further comprising:

determining a point of the jump $k\pi$ within the first pulse edge vector, wherein a computation of the second pulse edge vector as a function of the first pulse edge vector is dependent upon the point of the jump $k\pi$.

14. A device, comprising:

means for computing a first pulse edge vector as a function of a complex baseband signal; and means for computing a second pulse edge vector as a function of the first pulse vector in response to a detection of a jump $k\pi$ within the first pulse edge vector.

15. The device of claim 14, further comprising:

means for determining a least one natural sampling point as a function of the second pulse edge vector; and means for generating at east one pulse edge of a pulse width modulated signal, the at least one pulse edge corresponding to the at least one natural sampling point.

16. A device, comprising:

a first module operable to compute a first pulse edge vector as a function of a complex baseband signal, said first module further operable to compute a second pulse edge vector as a function of the first pulse vector in response to a detection of a jump $k\pi$ within the first pulse edge vector; and a second module operable to determine at least one natural sampling point as a function of the second pulse edge vector.

17. The device of claim 16, further comprising:

a third module operable to generate at least one pulse edge of a pulse width modulated signal, the at least one pulse edge corresponding to the at least one natural sampling point.

18. The device of claim 16, wherein said first module computes the first pulse edge vector according to:

$$\theta[n] = \begin{matrix} \angle x[n] + \sin^{-1}|x[n]| + 2l_1^1[n]\pi \\ \vdots \\ \angle x[n-L] + \sin^{-1}|x[n-L+1]| + 2l_1^L[n]\pi. \end{matrix}$$

19. The device of claim 16, wherein said first module computes the first pulse edge vector according to:

$$\theta[n] = \begin{matrix} \angle x[n] - \sin^{-1}|x[n]| + 2l_1^1[n]\pi \\ \vdots \\ \angle x[n-L] - \sin^{-1}|x[n-L+1]| + 2l_1^L[n]\pi. \end{matrix}$$

20. The device of claim 16, wherein the jump $k\pi$ is detected according to:

$$\bigcup_m \left( \frac{3\pi}{4} < \left| \theta^m[n] - \theta^{m-1}[n] \right| < \frac{5\pi}{4} \right).$$

21. The device of claim 16, wherein:

said first module is further operable to determine a point of the jump $k\pi$ within the first pulse edge vector; and a computation of the second pulse edge vector as a function of the first pulse edge vector by said first module is dependent on the point of the jump $k\pi$.

\* \* \* \* \*